US012181506B1

United States Patent
Majidi-Ahy et al.

(10) Patent No.: US 12,181,506 B1
(45) Date of Patent: *Dec. 31, 2024

(54) USING VAPOR CELL SENSORS TO PERFORM OVER-THE-AIR TESTING OF CELLULAR BASE STATIONS

(71) Applicant: WaveRyde Instruments Inc., Waterloo (CA)

(72) Inventors: Reza Majidi-Ahy, Waterloo (CA); James P. Shaffer, Waterloo (CA)

(73) Assignee: WaveRyde Instruments Inc., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/605,321

(22) Filed: Mar. 14, 2024

Related U.S. Application Data

(60) Provisional application No. 63/586,927, filed on Sep. 29, 2023.

(51) Int. Cl.
*G01R 29/08* (2006.01)
*H04W 24/08* (2009.01)

(52) U.S. Cl.
CPC ........ *G01R 29/0885* (2013.01); *H04W 24/08* (2013.01)

(58) Field of Classification Search
CPC .......................... G01R 29/0885; H04B 17/191
USPC .......................................................... 324/97
See application file for complete search history.

(56) References Cited

U.S. PATENT DOCUMENTS 10,440,597 B2 * 10/2019 Myron .................. H04W 24/08
10,564,201 B1   2/2020 Shaffer
10,802,066 B1 * 10/2020 Keaveney ............... G01R 29/10
11,428,806 B2 *  8/2022 Weiner .................... B64G 1/105
2015/0192532 A1 *  7/2015 Clevenson ........... G01N 24/006
324/304
2016/0363617 A1 * 12/2016 Anderson .......... G01R 29/0885

(Continued)

FOREIGN PATENT DOCUMENTS

WO         2022113043       6/2022
WO    WO-2022113043 A1 *  6/2022  ........... H04B 10/077

OTHER PUBLICATIONS

"3GPP technical specification TS38.104, Base station (BS) radio transmission and reception (release 16)", https://portal.3gpp.org/Specifications.aspx?q=1&series=45&releases=all&draft=False&underCC=False&withACC=False&withBCC=False&numberNYA=False, Jun. 2020.

(Continued)

*Primary Examiner* — Christopher P McAndrew
(74) *Attorney, Agent, or Firm* — Henry Patent Law Firm PLLC

(57) ABSTRACT

In a general aspect, vapor cell sensors are used to perform over-the-air (OTA) testing of cellular base stations. In some implementations, a vapor cell sensor including a vapor having Rydberg states is tuned to a carrier frequency of RF radiation emitted from a cellular base station. A first set of optical signals is generated based on an interaction between the vapor and a synchronization signal transmitted from the cellular base station. The vapor cell sensor is tuned to a harmonic of the carrier frequency. A second set of optical signals is generated based on an interaction between the vapor and the RF radiation. The first and second sets of optical signals are converted to digital data. The digital data is processed to detect a condition of the cellular base station.

26 Claims, 2 Drawing Sheets

(56) References Cited

U.S. PATENT DOCUMENTS

| | | | | |
|---|---|---|---|---|
| 2018/0270345 A1* | 9/2018 | Kissling | .................. | H04K 3/94 |
| 2019/0187198 A1* | 6/2019 | Anderson | .......... | G01R 29/0878 |
| 2020/0292606 A1* | 9/2020 | Holloway | .......... | G01R 29/0892 |
| 2020/0295838 A1* | 9/2020 | Gordon | ................ | H04B 10/548 |
| 2022/0196716 A1* | 6/2022 | Anderson | .............. | G01R 29/10 |
| 2022/0276293 A1 | 9/2022 | Compton et al. | | |

OTHER PUBLICATIONS

"Radio Frequency Safety _ Federal Communications Commission", accessed on Feb. 29, 2024, 6 pages.

"Spurious Emission Measurement on 5G NR Base Station Transmitters and Receivers", https://www.tek.com/en/documents/application-note/spurious-emission-measurement-5g-nr-base-station-transmitters-and), Accessed on Feb. 29, 2024, 8 pages.

Cleveland, Jr, Robert F, et al., "Evaluating Compliance with FCC Guidelines for Human Exposure to Radiofrequency Electromagnetic Fields", Federal Communications Commission Office of Engineering & Technology, Aug. 1997, 84 pages.

USPTO, Non-Final Office Action issued in U.S. Appl. No. 18/605,437 on May 21, 2024, 24 pages.

ISA, International Search Report and Written Opinion issued in Application No. PCT/CA2024/051110 on Oct. 31, 2024, 10 pages.

\* cited by examiner

USING VAPOR CELL SENSORS TO PERFORM OVER-THE-AIR TESTING OF CELLULAR BASE STATIONS

CROSS-REFERENCE TO RELATED APPLICATIONS

This application claims priority to U.S. Provisional Patent Application No. 63/586,927, filed Sep. 29, 2023, entitled "Using Vapor Cell Sensors to Perform Over-the-Air Testing of Cellular Base Stations." The above-referenced priority document is incorporated herein by reference.

TECHNICAL FIELD

The following description relates to using vapor cell sensors to perform over-the-air (OTA) testing of cellular base stations.

BACKGROUND

Wireless communication systems, including 5G and 6G wireless communication systems operating in both microwave (FR1, <7.125 GHZ) and millimeter-wave (FR2, >24.250 GHz) bands, use directional beamforming antenna arrays to generate wireless signals. These antenna arrays can be tested to detect problems and to monitor their performance. For example, over-the-air (OTA) testing can be used to characterize the performance of cellular base station antenna arrays.

DETAILED DESCRIPTION

Figure 1:
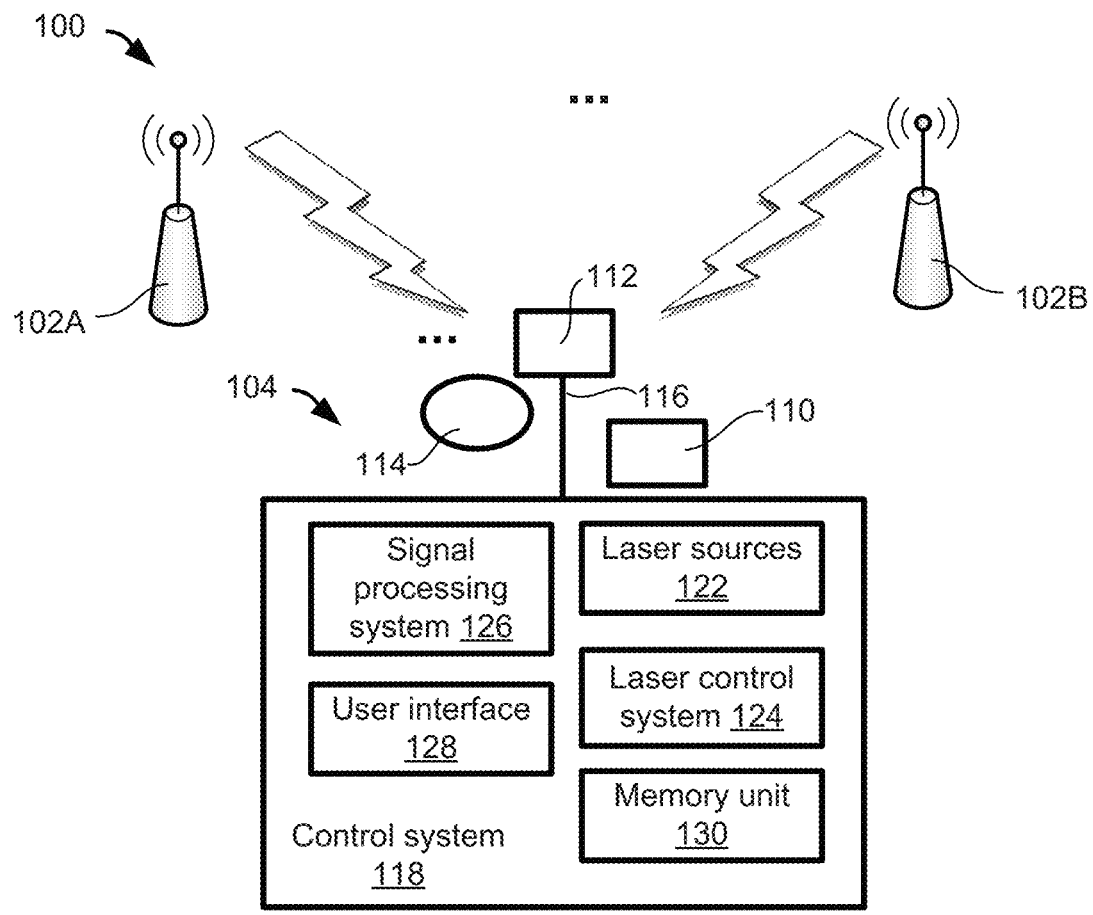
FIG. 1 is a schematic diagram showing aspects of an example Rydberg atom-based over the air (ROTA) testing system.

In a general aspect, a testing system detects electromagnetic radiation emitted from wireless communication nodes in a wireless communication network. In some examples, the testing system is a Rydberg-atom based over the air (ROTA) testing system that detects out-of-band and spurious emissions (which may include, e.g., harmonics, inter-modulations, other non-linear induced emissions, etc.) from a base station of a cellular network. In some instances, the ROTA testing system includes a Rydberg atom-based sensor and a control system communicably coupled to the Rydberg atom-based sensor.

In some implementations, the testing systems described here can be used to characterize wireless communication systems, including 5G and 6G wireless communication systems operating in both microwave (FR1, <7.125 GHZ) and millimeter-wave (FR2, >24.250 GHz) bands, that use directional beamforming antenna arrays to generate wireless signals. 5G and 6G wireless communication systems offer significant improvements in speed, capacity, and latency over previous generations. Spurious emissions from base stations of the 5G and 6G wireless communication systems can degrade the performance of the communication system (e.g., potential outage, poor coverage, low usable bandwidth and high latency), and cause interference with other wireless communication systems. Detecting and monitoring spurious emissions from the base stations in 5G or 6G wireless communication systems is important, for example, to ensure base station transmitters comply with 3GPP standards. The testing systems described here may also be adapted to characterize other types of wireless communication networks (e.g., Wi-Fi networks, etc.) and other components of cellular communication systems (e.g., user equipment, etc.). The testing systems described here can be also used with other wireless communication systems, and for isotropic signals where the beams do not have to be captured.

In some wireless communication systems, spurious emissions are emitted from electronic devices outside the channel bandwidth resulting from the modulation process and non-linearity in the transmitter. They can be caused by a variety of factors, such as non-linearity in the circuit components, parasitic oscillations, and poor shielding. Spurious emissions can interfere with other electronic devices and can also cause problems with electromagnetic compatibility (EMC) or electromagnetic field (EMF). Spurious emissions are a concern for 5G and 6G wireless communication systems because they operate at very high frequencies. At these frequencies, it is more difficult to filter out unwanted signals. Additionally, 5G and 6G systems often use multiple antennas, which can increase the likelihood of spurious emissions. Spurious emissions from 5G and 6G systems can interfere with other wireless systems, such as satellite communications, radar, and aviation navigation systems. They can also interfere with medical devices, such as pacemakers and hearing aids.

In some examples, a 5G new radio (NR) measurement application running on a signal analyzer can conduct measurements and perform the tests that are specified by the applicable standards. For instance, a ROTA testing system may provide partial or full coverage of transmitter tests specified by 3GPP 5G-NR or other types of tests. As an example, conformance tests can detect channel power and occupied bandwidth, adjacent channel leakage ratio (ACLR), operating band unwanted emissions (OBUE), spurious emission, transmit on/off power, error vector magnitude (EVM), frequency error, and time alignment error (TAE). In some examples, to ensure base station transmitters comply with 3GPP standards, transmitter characteristics are evaluated, and test measurements are performed on output power, output power dynamics, transmit on/off power, transmit signal quality, unwanted emissions, and transmitter intermodulation. Other types of tests may be used in other contexts.

In 5G or 6G wireless communication systems, a phased-array antenna may be fully integrated with the front-end of a 5G radio transceiver, without availability of a connector to the interface to directly probe the system. Over-the-air (OTA) testing is an approach that can be used to measure the wireless performance and reliability of base station antenna systems by capturing wireless communication signals emitted from base stations. In some conventional systems, out-of-band (OOB) spurious emissions (including harmonics, inter-modulations, and other nonlinearity induced emissions) testing can be difficult to make over the air, for example, when the test setup needs to cover a wide range of frequencies (e.g., from 30 MHz to 120 GHz or the second harmonic, whichever is lower, in the case of FR2 devices). Using a probe antenna that covers the entire frequency range with suitable antenna pattern and gain is difficult. For example, in certain conventional systems, different antennas have to be utilized for sensing harmonics, especially in the so-called FR2 bands above ~24 GHz.

In some implementations, the systems and techniques described here can provide technical advantages and improvements relative to conventional technologies. In some cases, the systems and techniques described here can be used to perform periodically scheduled tests for conformance, to verify/identify faulty base stations in the field. The methods and systems presented here can be implemented in a non-invasive manner and may provide accurate and repeatable characterization of the base station. The methods and systems presented here may provide a unique combination of benefits, including, for example, absolute power (electric-field) measurement, self-calibration, ultra-broadband (e.g., 1 to 100 GHZ), and the ability to perform these measurements in the Fresnel-zone (e.g., close to the base station antenna) without damaging the sensor. These and other benefits may be achieved, in some cases, due to non-perturbative nature of Rydberg-based vapor cell sensors in the ROTA testing system; for instance, the vapor cell may be constructed from dielectric material, and without conductors, in some cases. In some examples, the methods and systems presented here do not require an external mixer or antenna hardware changes to cover the ultra-broad frequency range. In some examples, the methods and systems presented here allow characterization of transmitters in base stations that are deployed and already in the field, in the production cycle, during installation, and also in the research and development phase. In some cases, a combination of these and potentially other advantages and improvements may be obtained.

FIG. 1 is a schematic diagram showing aspects of an example wireless communication environment 100. As shown in FIG. 1, the example wireless communication environment 100 includes a wireless communication network including two network side communication nodes or cellular base stations (BS) 102A, 102B. In some implementations, the base stations 102A, 102B are capable of wireless and/or wired communications. In some instances, each of the base stations 102A, 102B may be a node B, an E-utran Node B (also known as Evolved Node B, eNodeB or eNB), a pico station, a femto station, or other another type of communication node. The wireless communication network may further include a terminal side node or a user equipment (UE) 110, which can be a long-range communication system like a mobile phone, a smart phone, a personal digital assistant (PDA), tablet, laptop computer, or a short-range communication system such as, for example a wearable device, a vehicle with a vehicular communication system, or another type of communication node. The wireless communication environment 100 may generally include any number of cellular base station nodes, user equipment nodes, and other related equipment. The wireless communication environment 100 may include additional or different features, and the components of the wireless communication environment 100 may operate as described with respect to FIG. 1 or in another manner. For example, the wireless communication environment 100 may include more than two cellular base stations; or may include other types of wireless communication nodes.

In some instances, each of the base stations 102A, 102B may include various components and modules coupled and interconnected with one another to support its operation. For example, each of the base stations 102A, 102B may include a BS transceiver module, a BS antenna array, a BS memory module, a BS processor module, a network interface, a data communication bus, and other components. Similarly, the UE 110 may include various components and modules coupled and interconnected with one another to support its operation. For example, the UE 110 may include a UE transceiver module, a UE antenna, a UE memory module, a UE processor module, an input/output (I/O) interface, a date communication bus, and other components. In some implementations, the various components or modules of the base stations 102A, 102B or the UE 110 in the wireless communication environment 100 may be implemented in hardware, software, firmware, or a combination thereof.

The base stations 102A, 102B communicate with the UE 110 via a communication channel, which can be a wireless channel or other wireless medium. In some instances, the antenna array of the base stations 102A, 102B is configured to produce a spatial distribution of electromagnetic radiation having at least a portion focused along a target direction. For example, an antenna array of the base stations 102A, 102B may include one or more MIMO (multiple input multiple output) antennas operable to form beams of electromagnetic radiation. The target direction may be selected to direct wireless signals toward the UE 110, which is configured to receive the electromagnetic radiation from the base stations 102A, 102B. For example, the base stations 102A, 102B may utilize beamforming dynamic information (e.g., a beamforming feedback matrix, or other beamforming information) to direct signals to the UE 110.

As shown in FIG. 1, the example wireless communication environment 100 includes a Rydberg atom-based over-the-air (ROTA) testing system 104 that is configured to characterize the electromagnetic radiation emitted from the base stations 102A, 102B of the wireless communication network. In some instances, the ROTA testing system 104 can be configured to perform some or all of the operations in the example process 200 shown in FIG. 2; or the ROTA testing system 104 may operate in another manner. In some implementations, the ROTA testing system 104 is configured to provide absolute, self-calibrated measurement; ultra-broadband carrier bandwidth (e.g., 1 to 100 GHz) as a spectrum analyzer; and the ability to perform these functions in the Fresnel-zone (e.g., much closer to the antenna array of the base stations 102A, 102B). For instance, these and potentially other capabilities may be provided by using a non-perturbative, all dielectric vapor cell in a probe head. The ultra-broadband nature of the ROTA testing system 104 can be used for nonlinear characterization or conformance-testing of 5G-6G base station transmitters in the field during active operation or during installation. In some instances, the ROTA testing system 104 can be used to characterize components (e.g., transmitters) of the base stations 102A, 102B during a pre-installation stage, e.g., during R&D, in a production lab, in a chamber facility, or elsewhere.

In some cases, with a single probe head, the ROTA testing system 104 can measure harmonics and inter-modulations for FR2 transmitters. This can be accomplished, for example, by changing a coupling laser wavelength in order to tune the system to a different radio frequency target. In some implementations, the ROTA testing system 104 does not require an external mixer, amplifiers, or changes between multiple antennas. In some conventional systems, the need for external mixer, amplifiers, and changes between multiple antennas can be expensive, complicated, difficult to transport to remote sites, and may provide limited accuracy and require additional power support, to obtain a similar frequency coverage.

For some cellular networks, characterization is a requirement for conformance testing and is important for health-monitoring of the transmitters of the base stations. In such contexts, measurements that can be correlated over time and space accurately are advantageous since degradation of the transmitter can be detected early, allowing an operator to plan replacement without affecting service. In some implementations, the ROTA testing system 104 empowers the base-station owner (e.g., mobile service-provider and tower-site owners) to periodically test for conformance, verify functionality, and identify faulty, or failing base-stations in the field. In some instances, nonlinear effects in the radio front-end can degrade communication quality and system performance. Therefore, by measuring and monitoring the nonlinearity and other potential parameters connected to base-station health, the ROTA testing system 104 may enable unique methods of non-invasive accurate testing of the condition of cellular base stations.

In some instances, the ROTA testing system 104 can provide broadband OTA testing for unwanted electromagnetic fields, including harmonics, inter-modulations, and spurious emissions, to ensure cellular base stations meet the 5G-6G requirement of electromagnetic field compliance (EMC) and ElectroMagnetic Field (EMF) requirements. These tests are intended to assure the public that they are not exposed to unhealthy amounts of radiation. Likewise, these tests are used to prevent interference from affecting other equipment in the area of the base stations 102A, 102B. The example ROTA testing system 104 can fundamentally simplify the out-of-band and in-band characterization of the transmitters of the base stations 102A, 102B deployed in the field during active operation, during installation, in the production cycle, and also in the research and development phases.

In some instances, the ROTA testing system 104 can detect out-of-band emissions from the cellular base stations 102A, 102B. In some implementations, out-of-band (OOB) emission includes emission on a frequency or frequencies immediately outside the necessary bandwidth which results from the modulation process. In some instances, the ROTA testing system 104 can detect spurious emissions from the cellular base stations 102A, 102B. In some implementations, spurious emissions are emissions which are caused by unwanted transmitter effects such as harmonics emission, parasitic emission, intermodulation products, and frequency conversion products. In some instances, spurious emissions does not include OOB emissions. In some instances, unwanted emissions could be also caused by nonlinearity under heavy load ($R_{cvr}$) or in another manner.

In some cases, the ROTA testing system 104 can acquire and process a synchronization signals (e.g., a primary synchronization signal (PSS), a secondary synchronization signal (SSS), or others) from the cellular base stations 102A, 102B. In some instances, the analysis of the synchronization signals can be used to determine a condition (e.g., health) of one or both of the cellular base stations 102A, 102B. In some cases, a beam identifier and a station identifier can be extracted from the synchronization signals, and the detected condition of the base station can be stored (e.g., in a database) and associated with the beam and/or station identifier.

As shown in FIG. 1, the example ROTA testing system 104 includes a vapor cell sensor 112, which can be implemented as a Rydberg atom-based vapor cell sensor. In some instances, the example ROTA testing system 104 includes more than one vapor cell sensor 112. In some instances, each vapor cell sensor 112 includes a vapor in an enclosed volume (e.g., in a vapor cell). The vapor is used as a medium to interact with electromagnetic radiation emitted by the base stations 102A, 102B. In some instances, the vapor cell sensor 112 may be implemented as a metrology vapor cell, a glass vapor cell, a microelectromechanical system (MEMS) vapor cell, or another type of engineered vapor cell based on metamaterial or photonic crystal principles.

In some implementations, the vapor cell sensor 112 utilizes the quantum states of Rydberg atoms for absolute measurement of electromagnetic radiation emitted from the base stations 102A, 102B. The vapor cell sensor 112 can be omni-directional and self-calibrated. In some instances, the vapor cell sensor 112 can be implemented with a wide carrier bandwidth so that the vapor cell sensor 112 does not need to be changed in order to detect the electromagnetic radiation at a carrier frequency and its higher order harmonics emitted from the base stations 102A, 102B. In some instances, the ROTA testing system 104 can be used to interact with respective electromagnetic radiation and detect harmonics of respective carrier frequencies at which the respective base stations 102A, 102B operate. In some implementations, output signals from the vapor cell sensor 112 are used to measure a condition of the base stations 102A, 102B (e.g., base station health), which in some cases can be used for early prediction of system failures and performance degradation or for other purposes.

In some instances, when used for characterization of the base stations 102A, 102B in the field, the vapor cell of the vapor cell sensor 112 can be hermetically sealed and packaged in an electromagnetically transparent dielectric material, such as polylactic acid (PLA) plastic materials and other dielectric material. The vapor cell can be mast mounted (telescopic) or fixed to another type of mount, like a tripod, for supporting the vapor cell and its associated optical components (e.g., waveguides, optical connectors, etc.).

In some implementations, the vapor cell is formed at least in part (wholly or partially formed) of a dielectric material that is transparent to the electromagnetic radiation. The vapor cell sensor 112 may be of the type described, for example, in the publication "Microwave electrometry with Rydberg atoms in a vapor cell using bright atomic resonances," by J. A. Sedlacek, et al. (*Nature Physics* 8, 819-824, 2012). Other types or configurations of a vapor cell sensor 112 may be used in some cases. The dielectric material may define a window for the vapor cell sensor 112, through which, the electromagnetic radiation is received. Examples of the dielectric material include silicon, silicate-based glasses, and quartz. The vapor cell sensor 112 may include atoms in a vapor state (e.g., vaporized $^{87}$Rb or $^{133}$Cs) that alter an optical transmission in response to the electromagnetic radiation. The optical transmission may be influenced by optical transitions of the atoms in the vapor state.

In some instances, output optical signals generated based on the interaction of the vapor in the vapor cell sensor 112 and the electromagnetic radiation from the base stations 102A, 102B are independent of an orientation of the dielectric cell relative to the base stations 102A, 102B. For example, the vapor cell may be rotated (i.e., spatially reoriented with respect to the base stations 102A, 102B) without impacting the output optical signals generated by the vapor cell sensor 112. In other words, the vapor cell can be omni-directional such that its operation is invariant under spatial rotations, providing a higher degree of stability. The output signals generated by the vapor cell sensor 112 are orientation-independent and rotation-invariant due to the physical (e.g., material) properties of the vapor cell. Because the measurements obtained from the vapor cell sensor 112 are orientation-independent and generally insensitive to changes in the spatial orientation of the vapor cell sensor 112, the measurements are highly repeatable and more robust. Thus, the vapor cell sensor 112 can provide more stable measurements, which can be reliably compared and tracked over time and at different locations.

As shown in FIG. 1, the ROTA testing system 104 further includes a control system 118 configured to communicate input optical signals to the vapor cell sensor 112 and to receive/process output optical signals from the vapor cell sensor 112. As shown in FIG. 1, the control system 118 includes two or more laser sources 122, a laser control system 124, a signal processing system 126, an interface 128, and a memory unit 130. In some instances, the control system 118 may include other components.

The example interface 128 may provide communication with other systems or devices. In some cases, the interface 128 includes a wireless communication interface that provides wireless communication under various wireless protocols, such as, for example, Bluetooth, Wi-Fi, Near Field Communication (NFC), GSM voice calls, SMS, EMS, or MMS messaging, wireless standards (e.g., CDMA, TDMA, PDC, WCDMA, CDMA2000, GPRS) among others. Such communication may occur, for example, through a radio-frequency transceiver or another type of component. In some cases, the interface 128 includes a wired communication interface (e.g., USB, Ethernet) that can be connected to one or more input/output devices, such as, for example, a keyboard, a pointing device, a scanner, or a networking device such as a switch or router, for example, through a network adapter.

The laser control system 124 can communicate control signals to the two or more laser sources 122 to generate two or more laser beams, which may be directed through the vapor in the vapor cell sensor 112 to probe and measure the response of the vapor to the received electromagnetic radiation. In some instances, the output optical signal from the vapor cell sensor 112 can be generated using electromagnetically induced transparency (EIT) or electromagnetically induced absorption (EIA). In some instances, a sub-Doppler method is useful for higher spectral resolution in the Autler-Townes regime and higher sensitivity. In some instances, the two or more laser beams generated by the two or more laser sources 122 are locked to a stable, narrow bandwidth reference such as a frequency comb, interferometer, atomic or molecular absorption line, or another type of reference. As shown in FIG. 1, the vapor cell sensor 112 is coupled to the control system 118 via a transmission medium 116, e.g., optical fibers or other optical communication links.

In some aspects of operation, the antenna arrays of the base stations 102A, 102B generate radio frequency (RF) radiation (e.g., RF pulses or other signals) for cellular communication. In some cases (e.g., during an active operation stage of the cellular base stations 102A, 102B), the UE 110 sends signals to the base stations 102A, 102B, and thereby causes the base stations 102A, 102B to direct signals toward the location of the UE 110 (e.g., using beamforming). In such cases, because the UE 110 is located at the vapor cell sensor 112, the base station signals are directed toward the location of the vapor cell sensor 112. In some cases (e.g., during a preinstallation stage or an installation stage of the cellular base stations 102A, 102B), the base stations 102A, 102B direct signals toward the location of the vapor cell sensor 112 independent of any UE. In such cases, the UE 110 is not necessarily present, and the direction of the base station signals can be controlled by a technician, by a testing algorithm, or otherwise.

In some aspects of operation, RF radiation or other electromagnetic radiation from the base stations 102A, 102B are received by the vapor cell sensor 112, and the RF radiation pass through a window (e.g., formed of the dielectric material) of the vapor cell to interact with the vapor residing in the vapor cell. During such interaction, input optical signals from the two or more laser sources 122 can be communicated to the vapor cell sensor 112. The input optical signals pass through the atoms in the vapor state, which undergo a change in optical transmission due to the presence of the electromagnetic radiation from the base stations 102A, 102B. For example, the two or more laser sources 122 may produce a first input optical signal (a probe laser signal) and a second input optical signal (a coupling laser signal) that pass through the atoms in the vapor state. The first input optical signal may experience a frequency-dependent absorption (or transmission) due to the presence of the electromagnetic radiation from the base station. Such a phenomenon may represent an atom-based, electromagnetically induced transparency (EIT). In some instances, the vapor cell sensor 112 generates output optical signals based on the interaction in the vapor cell. The output optical signals may be based on the input optical signals after interacting with the atoms in the vapor state. In some instances, amplitude values of radio-frequency electric fields can be measured by operation of the vapor cell sensor 112. Large Rydberg atom polarizability and strong dipole transitions between energetically nearby states are highly sensitive to electrical fields. In some implementations, the amplitude values of the RF electric fields can be used to determine the power of the synchronization signal emitted from the cellular base station, which is indicative of the transmitter power (of each beam) of the cellular base station.

In some implementations, the signal processing system 126 may be configured to receive the output optical signals from the vapor cell sensor 122; process the output optical signals to identify a synchronization signal; and to identify properties of the synchronization signal. In some instances, the signal processing system 126 may be configured to perform other functions. In some instances, the signal processing system 126 of the control system 118 includes a photodetector to detect the output optical signals from the vapor cell sensor. The photodetector senses changes in the transmission caused by the electromagnetic radiation received from the base stations 102A, 102B through the vapor cell sensor 112. An output electrical signal generated by the photodetector can be converted to digital data that can be processed on a data processing apparatus (e.g., an FPGA, a GPU, a microprocessor, or some combination thereof, including a specialized hybrid processor). The digital data can be processed to determine properties of the electromagnetic radiation experienced by the vapor over the time period when the output optical signals were generated. In some instances, the signal processing system 126 may process the digital data to determine at least one of a start time, a duration, an amplitude, a frequency, a polarization, and other properties of RF radiation experienced by the vapor during the time period. In some instances, the memory unit 130 is configured to store the digital data as a function of time generated from a respective photodetector associated with a vapor cell sensor 112. The data can be made available (e.g., in whole or in part) to users or other systems via the interface 128 of the control system 118.

In some instances, the control system 118 includes computer-readable code that can be stored in the memory unit 130 and executed on a data processing apparatus. The computer-readable code may be presented to a user (e.g., via a user interface), and it may be modified or updated (e.g., based on user input or other information) to modify values of control parameters of the laser control system 124, values of processing parameters of the signal processing system 126, or values of other parameters. The interface 128 may also be used to run diagnostics to monitor the health of the ROTA testing system 104. In some instances, the control system 118 includes an autonomous system, which may interface with a user through the interface 128 or otherwise. In some instances, the autonomous system may be configured to automatically run in the background to perform functions such as maintaining the laser frequencies at fixed values, maintain laser power, apply signal processing, e.g., using matched filters, etc.

As shown in FIG. 1, the wireless communication environment 100 includes a location detection system 114. In some instances, the location detection system 114 may be a Global Navigation Satellite System (GNSS) receiver configured to provide location information of the vapor cell sensor 112. For example, the location detection system 114 in the ROTA testing system 104 may be compatible with at least one of the following technologies, Global Positioning System (GPS), GLObal Navigation Satellite System (GLONASS), Galileo, or Beidou. Another type of geolocation device or system may be used to provide location information, in some cases. In some instances, the location detection system 114 is configured to determine the measurement location of the vapor cell sensor 112. In some instances, the location detection system 114 is included in the UE 110 or another device. When the vapor cell sensor 112 is located with the UE 110, the location of the UE 110 (identified by the location detection system 114) can be used as the measurement location of the vapor cell sensor 112.

In some instances, the example ROTA testing system 104 may be disposed on a mobile platform, such as a service van. The mobile platform may be operable to transport at least the vapor cell sensor 112 of the ROTA testing system 104 to other measurement locations. In other implementations, the ROTA testing system 104 is disposed on a stationary platform adjacent to the base stations 102A, 102B. For example, the ROTA testing system 104 may be disposed adjacent to a ground-level portion of the base stations 102A, 102B in a protective enclosure (e.g., a service shed). In some instances, the control system 118 may be co-located with the cellular base station or have direct access to a control system of the cellular base station, e.g., for beam steering purposes.

In some implementations, the vapor cell sensor 112 resides in a Fresnel zone associated with the cellular base station during operation of the vapor cell sensor 112; and the process 200 can be used to determine a condition of the cellular base station based on the interaction of the vapor cell sensor 112 in the Fresnel zone of the cellular base station with the electromagnetic radiation emitted from the cellular base station. In some implementations, a Freznel zone is in a source free region in which wave propagation can be described using the Helmholtz equation for the scalar electromagnetic field using a binomial expansion of the radial vector connecting points in the source to the image plane. In some implementations, the Fresnel approximation includes the quadratic term; and a Freznel zone is a region satisfying $Z<D^2/\lambda$, where $Z$ is the propagation distance to the new, measurement plane; $D^2$ is the area of a hypothetical square aperture; and $\lambda$ is the wavelength.

In some instances, the vapor cell sensor 112 may remain fixed in place relative to the cellular base station allowing changes in emission over a period of time to be more easily tracked. In some instances, the vapor cell sensors 112 may be placed on the cell towers or antenna arrays of the base stations 102A, 102B or other cellular base stations. In this case, vapor cell sensors 112 associated with different cellular base stations may be connected to a central signal processing system via optical fibers enabling simultaneous measurement and characterization of cellular base stations at multiple field points. In some instances, components of the ROTA testing system 104 can be battery powered or powered by a generator (e.g., a vehicle engine running an alternator to charge a battery and supply DC power) for remote field testing, plugged into wall power, or both.

Figure 2:
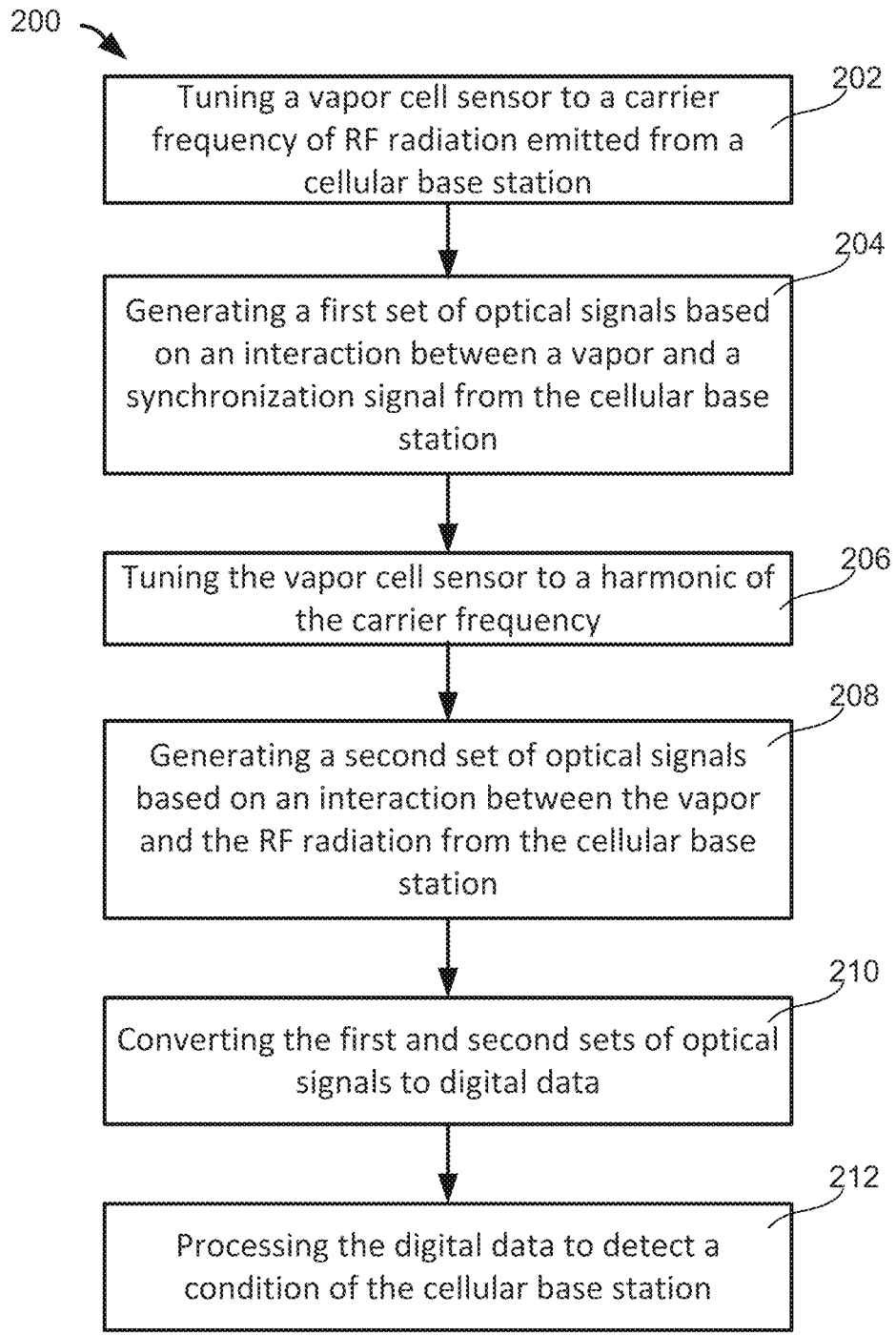
FIG. 2 is a flow chart showing aspects of an example process for ROTA testing of cellular base stations.

FIG. 2 is a flow chart showing aspects of an example process 200 for performing over-the-air testing of a cellular base station. The example process 200 can be used, for example, to operate a ROTA testing system in a wireless communication environment, e.g., the example ROTA testing system 104 in FIG. 1 or another type of testing system. For instance, the example process 200 can be used to perform characterization of radio frequency signals from a wireless communication node of a wireless communication network (e.g., a cellular base station in a cellular communication network). The example process 200 may include additional or different operations, including operations performed by additional or different components, and the operations may be performed in the order shown or in another order. In some implementations, one or more operations in the example process 200 can be performed by a computer system, for instance, by a digital computer system having one or more digital processors (e.g., data processing apparatus of the control system 118 in FIG. 1) that execute instructions (e.g., instructions stored in the memory unit 130 of the control system 118 in FIG. 1).

In some implementations, the example process 200 is implemented to measure power and nonlinear properties of a beam emitted by a cellular base station in a wireless communication network in the field during active operation. In some instances, the example process 200 is used to conduct testing during research and development or another pre-installation stage (e.g., with the base station operating in a laboratory environment rather than deployed in the field). In some instances, the example process 200 can be performed during an installation stage of the cellular base station to detect the condition of the cellular base station during the installation stage. In some instances, the example process 200 may be performed under other conditions.

At 202, a vapor cell sensor is tuned to a carrier frequency of radio frequency radiation emitted from a cellular base station. In some instances, a carrier frequency at which a cellular base station operates may be a known value, e.g., the center frequency of a communication channel. In this case, the ROTA testing system can be configured according to the carrier frequency. In particular, a laser control system and a signal processing system (e.g., the laser control system 124 and the signal processing system 126 of the control system 118 in the ROTA testing system 104 shown in FIG. 1) may be configured by inputting the carrier frequency through a user interface (e.g., the user interface 128). In some instances, the ROTA testing system may be configured to scan a frequency range around the carrier frequency. For example, for a cellular base station with a carrier frequency of 28 GHz, the ROTA testing system can be configured to scan a frequency range from 26 GHz to 30 GHz to search for other signals that could possibly interfere with the electromagnetic radiation emitted from the cellular base station. In some instances, the carrier frequency and its harmonics are in a microwave frequency range below 7.125 GHZ, a millimeter-wave frequency range above 24.25 GHZ, or in another frequency range. For example, a coupling laser in the ROTA testing system 100 or one of the coupling lasers when the ROTA testing system 100 includes more than two lasers can be tuned to a Rydberg state with a resonance frequency overlapping with the carrier frequency of a particular beam of the base stations 102A, 102B. In some instances, the ROTA testing system may be tuned to allow an interaction between the vapor of Rydberg atoms in the vapor cell sensor and the radio frequency radiation at the carrier frequency and its harmonics emitted by the cellular base station.

In some instances, a synchronization signal is emitted periodically by the cellular base station. The synchronization signal can be or include, for example, a 5 ms signal with a 20 ms period (nominally for 5G-NR). In some instances, the synchronization signal may be emitted periodically by the cellular base station with a different signal length and period (e.g., 5, 10, 40, 80 ms or another period). In some instances, the synchronization signal emitted may have a constant signal length of 5 ms or another duration. In some implementations, during the off-time of the synchronization signal, wireless communication data can be transmitted between the cellular base station and a user device. In some cases, the fundamental frequency of the synchronization signal may be fixed at the carrier frequency. In some other cases, the fundamental frequency of the synchronization signal may not be fixed at the carrier frequency and can be located anywhere across the carrier bandwidth. In this case, the ROTA testing system may be tuned to allow an interaction between the vapor of Rydberg atoms in the vapor cell sensor and the synchronization signal transmitted from the cellular base station. In some instances, the synchronization signal may be used to configure the synchronization and channel selection for the user equipment.

In some instances, the vapor cell sensor can be fine-tuned to a frequency range overlapping with the frequency of a primary synchronization signal (PSS) and a secondary synchronization signal (SSS), e.g., subcarrier occupation of the PSS and SSS in the frequency domain. For example, the subcarrier occupation of the PSS or the SSS may be known; and the vapor cell sensor can be tuned to a frequency range overlapping with the subcarrier occupation of the PSS or SSS in the frequency domain. In some instances, the frequency range of the PSS or SSS can be located by scanning the ROTA testing system; and the operating frequency of the vapor cell sensor can be adjusted in order to overlap with the frequency range of the PSS or SSS for optimum sensitivity.

In some instances, a beam of a transmitter antenna of the cellular base station is adjusted to point towards the position of the vapor cell sensor. In some instances, the beam of a transmitter antenna of the cellular base station can be adjusted by initiating a communication between a user equipment at the measurement location and the cellular base station. In some instances, by initiating the wireless communication between a user device and the cellular base station, a beam of the transmitter antenna of the cellular base station can be adjusted to point towards the measurement location of the vapor cell sensor; and can be locked to the user device near the measurement location of the vapor cell sensor. In some instances, the direction of a beam can be adjusted by adjusting beam steering data associated with the beam, for example, by the operator of the cellular base station. In some instances, the location information obtained from 202 may be used so as to guide the adjustment of the beam steering.

At 204, a first set of output optical signals is generated by the vapor cell sensor based on an interaction between the vapor cell sensor and the synchronization signal from the cellular base station. In some implementations, two or more laser sources are configured to generate input optical signals that include at least one coupling optical signal and at least one probe optical signal. The two or more laser sources are in optical communication with the vapor cell sensor through a transmission medium (e.g., in free-space or through optical fiber) and as such, the coupling and probe optical signals can interact with the vapor having Rydberg states in the vapor cell sensor. Such interaction may allow the vapor cell sensor to perform Rydberg atom-based radio frequency sensing, and thereby generate the first set of output optical signals based on the coupling and probe optical signals. In some implementations, the first set of output optical signals may represent the response of the vapor having Rydberg states in the vapor cell sensor to the synchronization signal emitted from the cellular base station. In some instances, a vapor having Rydberg states can be a vapor of Rydberg atoms (e.g., Rb, Cs, etc.), Rydberg molecules (e.g., H2, I2, etc.) or possibly both. For example, the first set of output optical signal from the vapor cell sensor can be generated using electromagnetically induced transparency (EIT) or electromagnetically induced absorption (EIA). In some instances, a sub-Doppler method can be used to obtain higher spectral resolution in the Autler-Townes regime and higher sensitivity. In some instances, the one or more input optical signals are locked to a stable, narrow bandwidth reference such as a frequency comb, interferometer, atomic or molecular absorption line, or another type of reference.

In some instances, the coupling or probe optical signal can be scanned to obtain the first set of output optical signals. In certain examples, the probe optical signal can be used to generate a frequency comb in an optical heterodyne setup to obtain the first set of output optical signals. In some instances, a frequency comb read out of the first set of output optical signals can be implemented as described in the publication "Rydberg Atom-based Electrometry using a Self-heterodyne Frequency Comb Readout and Preparation Scheme," Physical Review Applied 19, 034078, 2023, or it may be possible to perform such a readout in another manner. In some instances, pulsed readout can be used to acquire the transmitter signals, perhaps in combination with laser frequency changes, as described in the publications "Sensing signals that include radio frequency pulses," U.S. Pat. No. 11,681,016, issued Jun. 20, 2023, and "The Origins of Rydberg Atom Electrometer Transient Response and its Impact on Radio-Frequency Pulse Sensing," Physical Review Applied 18, 034030, 2022; or it may be possible to acquire transmitter signals in another manner. In some instances, the coupling optical signal of the EIT or EIA-like system can be tuned to different Rydberg states to target different RF frequencies. In some instances, spectral signals within a bandwidth of ~250 MHz of the target frequency can be detected by analyzing the optical spectra for a single Rydberg transition and/or detuning the coupling and probe lasers that may be used for Rydberg atom-based sensing as described in the publication "Rydberg-Atom Sensors in Bichromatic Radio-Frequency Fields," Phys. Rev. Applied 20, 024068, 2023; or it may be possible to detect spectral signals in another manner. The optical signal necessary for monitoring the laser sources and keeping them stable can be routed via the waveguide through all or part of the ROTA testing system. Feedback to control the laser sources, including feed forwards, can be realized using FPGAs, analog electronics, or another processor-based system that can be controlled through a user interface and through autonomous control layers operating in different types of processors. When a frequency comb is used, the signal processing system of the ROTA testing system may include a real-time spectrum analyzer which can be used to detect the first set of output optical signal. In the case of a frequency comb, it is not necessary to scan either of the coupling and probe optical signals to read out the first set of output optical signals, although it is possible to use scanning and a frequency comb in combination with each other.

In some instances, an average optical spectrum may be obtained. For example, the average optical spectrum may be obtained using a frequency comb, or another technique. In some instances, the results can be fit to identify spurious signals within a specified range (e.g., ~250 MHz) of the carrier frequency using a software without tuning to a different Rydberg state. For example, the spurious signals may include signals that do not have the correct periodicities and those at unwanted frequencies. In some instances, an interferer close to the carrier frequency can lead to perturbed spectra, and a power scan of the beam can be used to identify avoided crossing in the data as described in the publication "Rydberg-Atom Sensors in Bichromatic Radio-Frequency Fields," Phys. Rev. Applied 20, 024068, 2023.

In some instances, two sets of laser beams can be passed through the vapor cell sensor. One set of laser beams can be configured to detect the synchronization signal block while the other set of laser beams with the probe beam configured as the frequency comb, is configured to acquire the spectrum. In some instances, when only one set of laser beams is used, a lock signal can be generated from the central comb line.

At 206, the vapor cell sensor is tuned to a harmonic of the carrier frequency of the electromagnetic radiation emitted from the cellular base station. In some implementations, the coupling optical signal is tuned to sense a higher-order harmonic (e.g., second, third, or other high-order) of the electromagnetic radiation emitted from the cellular base station. For example, the operating frequency of the coupling optical signal is tuned to a different Rydberg state that has an RF resonance frequency overlapping with the harmonics. In some instances, tuning the vapor cell sensor to a harmonic of the carrier frequency may be implemented similar to operation 202 at the carrier frequency or at the fundamental frequency of the synchronization signal.

At 208, a second set of optical signals is generated based on an interaction between the vapor cell sensor and the electromagnetic radiation emitted from the cellular base station. In some instances, obtaining the second set of optical signals in operation 208 may be implemented as the operation 204 at the carrier frequency or at the fundamental frequency of the synchronization signal. For example, the coupling laser is tuned to a Rydberg state that has a resonance frequency at the harmonic to be detected.

In certain instances, the synchronization signal may be averaged over multiple pulses to measure the power in a higher-order harmonic. When the measured power of the synchronization signal is small, for example when the vapor cell sensor is placed at a measurement location far away from the cellular base station or caused by other reasons such as interference, a more precise measurement may be required; and more averaging can be performed, for example, by repeatedly performing the operation 208 at higher-order harmonics.

In some instances, operations 206, 208 may be repeated for third, fourth, or other high-order harmonic as needed. The correlation between base station transmitter harmonics exceeding acceptable thresholds can be indicators of base station health, since excessive nonlinearity of the transmitter, such as lower than expected 1 dB-Compression points of the power amplifiers, can cause harmonics to appear.

At 210, the first and second sets of optical signals are converted to digital data. In some instances, the first and second sets of optical signals may be received by a photodetector (e.g., in the signal processing system 126 of the control system 118 in the example system 100 shown in FIG. 1). In this case, the photodetector senses changes in the transmission caused by the RF signals to the vapor cell sensor; and converts the first and second sets of optical signals to respective electrical signals. In some instances, the electrical signals are then converted (e.g., using analog-to-digital conversion circuitry, or otherwise) to digital data that can be processed on a FPGA, GPU, computer processor, or some combination thereof, including specialized hybrid processors.

At 212, the digital data is processed to detect a condition of the cellular base station. In some instances, the digital data can be used to detect the synchronization signal. In some instances, the digital data can be correlated with the different M-sequence interference patterns to determine the symbol. For example, the synchronization signal from the cellular base station may be decoded using matched filters. In some instances, the digital data may be used to determine different parameters of the base station, such as its power and beam or base station ID. In some instances, the one or more matched filters is applied to the digital data to generate a filtered signal. In some instances, the digital data may be compared to a response template, which represents a known response of the vapor to a target radio frequency pulse, by operation of a signal processing system (e.g., the signal processing system 126 in FIG. 1). These correlation coefficients are the projections of the possible symbols on the incoming signals at the maximum time of correlation, e.g., the matched filter aligned with the pulse carrying the synchronization signals. If unwanted interference signals exist within the signal bandwidth (pulse in the time domain) the projection will not strongly correlate with a single symbol. The information can be used to determine properties of the noise. In some examples, a convolution function may be applied to the digital data and response template to generate the filtered signal. In some instances, the filtered signal may be further processed, by operation of the signal processing system, to determine properties of the electromagnetic radiation experienced by the vapor over the time period. For example, the filtered signals may be processed; and at least one of the properties of the RF pulses experienced by the vapor in a time period can be identified, including a start time, a duration, an amplitude, a frequency, a polarization, and other properties.

In some implementations, the synchronization signal is identified with a matched filter. The encoding of the PSS and SSS can be done with multi-frequency symbols (OFDM) (channel spacing determined by the 5G-NR configuration), encoded using binary phase shift keying (BPSK). In certain instances, a matched filter can be constructed based on possible symbols in the PSS and SSS and possibly the Physical Broadcast Channel (PBCH) signals. In some instances, one or more matched filters can be used with the time-dependent signals that are acquired by the Rydberg sensor to readout the symbol. These correlation coefficients are the projections of the possible symbols on the incoming signals at the maximum time of correlation, e.g., the matched filter aligned with the pulse carrying the synchronization signals. If unwanted interference signals exist within the signal bandwidth (pulse in the time domain) the projection will not strongly correlate with a single symbol.

In some instances, the digital data can be subjected to Fourier transform analysis in the FPGA or processing unit. Data from the FPGA or processing unit can be used to locate and measure incoming signals that vary in time and space, calculate parameters such as peak power, decode transmission information, and calculate derivative information based on the measurements. In some instances, the signal train is a phase modulated signal. For example, a PSS signal nominally lasts 5 ms and is repeated every 20 ms in 5G-NR with a period of 20 ms. The beam identification number can also be acquired by a receiver (e.g., a user device or a device that is designed to communicate with the cellular base station) placed near the vapor cell sensor.

In some implementations, the synchronization signal is identified by detecting an amplitude or phase change in the first set of optical signals. In some implementations, a phase shift (e.g., a pi phase shift) in the synchronization signal is detected. For example, the phase to amplitude conversion can occur because electromagnetically induced transparency (EIT) and electromagnetically induced absorption (EIA) are both coherent processes that depend on the phase of the driving fields, one of which is the synchronization signal emitted from the cellular base station. Under EIT or EIA conditions, a phase change of the synchronization signal causes a change in the probe laser transition polarization of the atomic vapor. A phase shift induces a change in the probe laser transmission. The transient response, which can induce both additional absorption and transmission, is due to the system equilibrating through optical pumping.

A phase change of the synchronization signal can lead to a change in the interference phenomena that are used to dress the atom so that it is sensitive to the synchronization signal, as well as readout the synchronization signal. When the phase of the synchronization signal changes, the transmission, or analogously the absorption, of the probe laser beam will exhibit large changes. The changes can be of the same size as an amplitude modulated RF field. The magnitude of the signal depends on the strength of the RF field and its phase. The phase change and the amplitude can both be used for encoding signals for applications like communications. The fact that the phase can be detected in this way is very useful because it is an all-optical method for detecting phase. In other words, the detection of phase does not require a local RF oscillator. Additionally, in many variations, there is no need for additional lasers or phase stabilization of the lasers.

In some implementations, the matched filters may also allow the system to pick out and/or separate the transient response and the steady-state response of the vapor in the vapor cell sensor. In some variations, the steady state response may occur at the backend of an RF pulse while the transient response is found at the leading edge of the RF pulse. The phase information is carried in the transient response of the one or more vapor cell sensors while the amplitude is associated with their steady-state signal. The matched filters can, in certain cases, be run in a massively parallel fashion using field programmable gate arrays (FPGAs) or graphics processing units (GPUs). Binary phase shift keying (BPSK) and even quadrature amplitude and phase (QAM) encodings are possible to readout. For example, two sets of EIT/EIA lasers can pass through a single vapor cell with one set detuned from resonance to add a phase shift of $\pi/2$. The two channels allow the in-phase (I) and out-of-phase components (Q) of the incoming RF wave to be detected in a single measurement (e.g., arbitrary phase and amplitude of the incoming RF wave). The repetition rates can be greater than 1 MHz, with sub-microsecond pulsing possible, which in turn, can allow a readout of 5G-NR channels (240 kHz maximum), particularly their synchronization channels. In some instances, detecting the QAM modulation of a single channel may be done in-lab or at install.

Once the synchronization signal is identified, properties of the synchronization signals can be determined. For example, the periodicity, arrival time, and various other properties of incoming, time dependent RF signals received by the vapor cell sensor from the cellular base station can be identified. In some implementations, an amplitude of a single pulse of the synchronization signal is measured to determine a power level of the synchronization signal. In certain instances, a set of pulses of the synchronization signal is detected; and the set of pulses of the synchronization signal can be averaged. In some instances, the digital data, the filtered signals, etc. can be stored in the memory unit 130 of the control system 118 for future evaluation in whole or in part, including the calculated data.

Once the synchronization signal is identified, operation of the control system (e.g., the control system 118 of the example ROTA system 100 shown in FIG. 1) can be synchronized with the synchronization signal emitted from the cellular base station. For example, the control system can be synchronized with the output of the cellular base station to allow the averaged pulse to be displayed, for example, in an oscilloscope mode. For another example, the ROTA testing system can obtain the period of the synchronization signal. In this case, the positions (in time) of each synchronization signal can then be easily identified by the ROTA system enabling more efficient signal processing. In some instances, other operations of the control system may be also synchronized with the synchronization signals of the cellular base station.

In some instances, the radio frequency detection frequency can be tuned across the channels to characterize the channel power at a fundamental frequency and its harmonics. For example, the vapor cell sensor can be tuned to different frequencies around the carrier frequency, the amplitude values of the RF electric fields at different frequencies can be measured. The fundamental and harmonic emission of the cellular base station can be measured by changing the wavelength of the coupling laser of the same vapor cell sensor. Both the control signals and communications signals can be analyzed and recorded to characterize the condition of the cellular base station.

In some instances, the harmonic of the carrier frequency of the electromagnetic radiation can be detected by looking at the time-dependent signal at a target frequency. The signal can be synchronized with the fundamental signal by using multiple Rydberg atom sensor channels. Once a harmonic is detected, the signal can be subject to either the M-sequence correlation routine or a Fourier transform to interrogate the spectral content in the signal. The M-sequence correlation may indicate if the harmonic signal is simply harmonics of the fundamental signal. In some instances, a signal as a function of the coupling laser frequency can also be used. By detecting the signal as a function of coupling laser frequency the detuning of the RF frequency from the Rydberg RF detection frequency can be determined by, for example, measuring the asymmetry of the Autler-Townes peaks. Detuning of the RF frequency from the Rydberg states transition frequency changes the mixture of bright and dark states that form the two Autler-Townes states making one transition stronger than the other. The relative amplitude of the Autler-Townes states can be used to determine detuning from the Rydberg RF transition.

In some instances, nonlinearity in continuous wave signals can be detected in addition to RF pulses received from the cellular base station. The synchronization signals from the cellular base station can be averaged together over time or acquired in real-time. In some instances, the synchronization signal may be the same over time and the strongest signal because it is the signal that a user device needs to acquire and to use in order to configure itself to communicate with the cellular base station.

In some implementations, the first and second sets of output optical signals are used to determine a measured value of a power level of the RF pulses at a harmonic of the carrier frequency, e.g., a nonlinear emission power level. In some instances, the measurement of a particular base station at its harmonics is the same as measuring the fundamental frequency, e.g., by measuring an amplitude of a single pulse or by averaging the amplitude of a set of pulses, except the vapor cell sensor is tuned to the harmonic frequency as described above. The measured value of the nonlinear emission power level with a regulatory threshold value of the nonlinear emission power level to determine the condition of the cellular base station. In some cases, the regulatory threshold values include values, according to EMC requirements, EMF requirements, or other requirements, specified by government regulatory agencies, for example, by the Federal Communications Commission (FCC) of the United States or by a regulatory body of another jurisdiction. In some cases, the regulatory threshold values include values specified by a standards body or a standards document. For example, the 3GPP specifications for Tx (transmitter) spurious emissions provide a regulatory threshold value, e.g., the maximum level of spurious emissions. In some examples, the maximum level of spurious emissions is −36 dBm in a frequency range of 30 MHz and 1000 MHz; −30 dBm for a frequency range of 1 GHz and 12.75 GHz; and −13 dBm for a frequency range of 12.75 GHz and second harmonic of the upper frequency edge of the uplink operating band in GHz. In some instances, the regulatory threshold value of the nonlinear emission or spurious emission power levels may have a different value for different countries or regions according to specific regional regulations or requirements.

A future value of the nonlinear emission power level for a future time can be determined based on the measured values (e.g., current and past) of the nonlinear emission power level to predict potential failure of the cellular base station. For example, data on the nonlinear emission power levels of the RF pulses emitted by respective cellular base stations at the different harmonics during an extended period of time can be stored in a control system (e.g., the control system 118 in FIG. 1) or a control center that is communicably connected to multiple control systems 118. The data which can be used as predictive standards is processed and analyzed using machine learning techniques or other statistical methods to evaluate performance of the respective cellular base stations and predict potential future failure of the respective cellular base stations. The individual measurements (those done on a particular station) are compared to the statistics of base stations that are functioning properly (both in the lab and field). The spatial positions where the measurements are made relative to the base station need to be fixed but there can be a range of different positions for each base station (or set of base stations). These levels can be also compared to data taken in the past on the same base station to see if the performance has been changed.

In some implementations, location information of the vapor cell sensor at a measurement location is obtained by operation of a location detection system of the ROTA testing system. For example, the location information of the vapor cell sensor at the measurement location can be detected by operation of the location detection system (e.g., the GNSS receiver 114) which is associated with the vapor cell sensor and placed close to the vapor cell sensor of the ROTA testing system. In some instances, a condition of the cellular base station determined using the example process 200 can be associated with the measurement location of the vapor cell sensor. In some instances, a distance between the vapor cell sensor and cell tower of the cellular base station can be determined based on the location information from the location detection system and a position map showing cell tower locations of cellular base stations. In some instances, the location information of the vapor cell sensor may be obtained in another manner. In some instances, the location information of the vapor cell sensor can be used to make measurements at the same measurement location over time. For example, when the measurement conditions are kept constant, a condition of the cellular base station at a particular point at installation measured at a measurement location can be compared with the condition of the cellular base station determined at 5 years (or generally, at any time point) after the installation at the same measurement location. In some instances, the vapor cell sensor of the ROTA testing system can be moved to a different measurement location; the location detection system can be used to detect the new measurement location of the vapor cell sensor; the ROTA testing system with the vapor cell sensor at the new measurement location can interact with the radio frequency radiation emitted by the cellular base station; and a condition of the cellular base station at the new measurement location can be detected and associated with the new measurement location. In certain instances, the location information may also be used to map the coverage of beams and therefore cellular base stations, or for other purposes.

In some implementations, testing results for the specific spatial location and testing time are saved and compiled. The output of the control system from the measurement may include the beam information and power at the different measurement points (frequencies, positions, etc.). Excessive nonlinearity of the base station transmitters (such as the power amplifier within) could result in significant reduction of capacity and coverage of such base stations. Base station transmitter harmonics exceeding acceptable thresholds are good indicators of transmitter excessive nonlinearity (such as lower than expected 1 dB-compression points of the power amplifiers). In some instances, transmitter power at different frequencies may be obtained.

In some instances, the operations in the example process 200 may be repeated for different spatial positions by shifting the location of the vapor cell sensor and the beam direction from the cellular base station. Testing of other beams emitted from the base station can be accomplished by adjusting the other RF transmitters of the BS to interact with the vapor cell sensor, using the methods that were used to measure the initial target beam, or in another manner. For example, operations of the example process 200 to operate a vapor cell sensor can be repeated during distinct time periods to detect the condition of the cellular base station during each of the distinct time periods. This allows a comparison and monitoring of the detected conditions of the cellular base station over months or years. For another example, the operations of the example process 200 can be performed by moving the vapor cell sensor to a different measurement location for characterizing a condition of a distinct cellular base station. Signals from many cellular base stations can be determined and compiled to generate data in order to detect deviations from normal operation.

In some instances, the data from the field testing in operation may be compared meaningfully with the data at install and in production because the ROTA is self-calibrated. Comparisons can take place at the fundamental frequency and at harmonics of the fundamental frequency without changing the vapor cell sensor 112. In some instances, the ROTA testing system 100 does not have to continuously sample the power during the transmission of the synchronization signal. For example, the ROTA testing system 100 may sample the synchronization signal over small time periods. For another example, the ROTA testing system 100 may receive the synchronization signals at a different time from other, secondary antennas. In some instances, when the tests are conducted during installation, the beam index is not required, since each beam can be individually tested and may be controlled by the installer.

After these operations, data may be analyzed for diagnostic purposes. For example, when a spurious emission is detected based on the measurement, the ROTA testing system 100 can alert the network operator of the wireless communication network so that they can take corrective actions. For example, an operator of the base stations 102A, 102B may adjust the antenna phase shifters, increase the power to the panel, replace the panel in the antenna (e.g., for the faulty beam), replace the base station, or take other actions.

Accuracy is important for predicting base station failure because it enables statistics on the electromagnetic radiation emitted at the fundamental, as well as harmonics, to be meaningfully recorded, compiled over a large number of samples, and compared over time. For example, the distribution of powers emitted by based stations at a number of geolocations can be compared to each other. When the accuracy is increased the acceptable distribution of emitted powers reflects the base station rather than the measurement device. The accuracy also enables the tracking of these distributions in time in a meaningful way. The power emission (fundamental, second harmonic, third harmonic, . . . ) at a selection of positions relative to the base station can be compared to statistics of a larger sampling of different base stations. If the operation of a particular base station deviates by more than a specified amount, for example 1 sigma of the distribution, then the base station can be scheduled for maintenance or replacement at a convenient time. The application is for predictive maintenance. The data analysis based on the accumulated statistics can be used to identify anomalies and potential equipment defects which can enable planned repairs before shutdowns occur. In some cases, the example process 200 can be utilized to minimize network downtime, avoid unplanned outages and minimize maintenance costs.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media.

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

In a general aspect, a vapor cell sensor is used to perform over-the-air (OTA) testing of cellular base stations.

In a first example, a method of performing over-the-air testing of a cellular base station includes tuning a vapor cell sensor, which includes a vapor having Rydberg states, to a carrier frequency of electromagnetic radiation emitted from the cellular base station; by operation of the vapor cell sensor tuned to the carrier frequency, generating a first set of optical signals based on an interaction between the vapor and a synchronization signal transmitted from the cellular base station; tuning the vapor cell sensor to a harmonic of the carrier frequency; by operation of the vapor cell sensor tuned to the harmonic of the carrier frequency, generating a second set of optical signals based on an interaction between the vapor and the electromagnetic radiation emitted from the cellular base station; and by operation of a control system communicably coupled to the vapor cell sensor, converting the first and second sets of optical signals to digital data; and processing the digital data to detect a condition of the cellular base station.

Implementations of the first example may include one or more of the following features. The RF radiation includes spurious emissions from the cellular base station, and generating the second set of optical signals includes generating the second set of optical signals based on an interaction between the vapor and the spurious emissions. The first and second sets of optical signals are generated during an installation stage of the cellular base station, and detecting the condition of the cellular base station includes detecting the condition during the installation stage. The first and second sets of optical signals are generated during an active operation stage of the cellular base station, and detecting the condition of the cellular base station includes detecting the condition during the active operation stage. The first and second sets of optical signals are generated during a pre-installation stage of the cellular base station, and detecting the condition of the cellular base station includes detecting the condition during the pre-installation stage.

Implementations of the first example may include one or more of the following features. The method includes operating a user equipment at a location of the vapor cell sensor. Operating the user equipment causes the cellular base station to direct the synchronization signal toward the vapor cell sensor during the operation of the vapor cell sensor. The first and second sets of optical signals are generated while the vapor cell sensor resides at a measurement location, and the method includes by operation of a location detection system associated with the vapor cell sensor, detecting the measurement location of the vapor cell sensor; and by operation of the control system, associating the detected condition of the cellular base station with the measurement location.

Implementations of the first example may include one or more of the following features. The measurement location is a first measurement location, the condition of the cellular base station is a first condition, and the method includes moving the vapor cell sensor to a second measurement location; by operation of the location detection system, detecting the second measurement location of the vapor cell sensor; by operation of the vapor cell sensor at the second measurement location, generating further sets of optical signals based on an interaction between the vapor and the synchronization signal transmitted from the cellular base station; and by operation of the control system, detecting a second condition of the cellular base station based on the further sets of optical signals; and associating the second condition of the cellular base station with the second measurement location.

Implementations of the first example may include one or more of the following features. The vapor cell sensor includes a dielectric cell that contains the vapor having Rydberg states, and the first and second sets of optical signals are independent of an orientation of the dielectric cell relative to the cellular base station. Processing the digital data includes detecting at least one of out-of-band emissions from the cellular base stations; or spurious emissions from the cellular base stations. The carrier frequency and the harmonic of the carrier frequency are in a microwave frequency range below 7.125 GHz. the carrier frequency and the harmonic of the carrier frequency are in a millimeter-wave frequency range above 24.25 GHz. The vapor cell sensor resides in a Fresnel zone associated with the cellular base station during operation of the vapor cell sensor.

Implementations of the first example may include one or more of the following features. The method includes identifying the synchronization signal by detecting a transient phase change in the first set of optical signals; and synchronizing operation of the control system with the synchronization signal. Processing the digital data includes passing the digital data through one or more matched filters to identify properties of the synchronization signal. Processing the digital data includes measuring a single pulse of the synchronization signal. Processing the digital data includes detecting a set of pulses of the synchronization signal; and averaging the set of pulses of the synchronization signal. Processing the digital data includes detecting a phase shift in the synchronization signal. Processing the digital data includes measuring an amplitude of a single pulse to determine a power level of the synchronization signal.

Implementations of the first example may include one or more of the following features. The method includes tuning the vapor cell sensor to a second harmonic of the carrier frequency; by operation of the vapor cell sensor tuned to the second harmonic of the carrier frequency, generating the second set of optical signals based on the interaction between the vapor and the electromagnetic radiation transmitted from the cellular base station; tuning the vapor cell sensor to a third harmonic of the carrier frequency; by operation of the vapor cell sensor tuned to the third harmonic of the carrier frequency, generating a third set of optical signals based on an interaction between the vapor and the electromagnetic radiation transmitted from the cellular base station; and by operation of the control system, converting the first, second and third sets of optical signals to the digital data; and processing the digital data to detect a condition of the cellular base station. Passing the digital data through one or more matched filters includes constructing the one or more matched filters using frequency-domain signal processing techniques; and decoding the synchronization signal from the cellular base station using the one or more matched filters.

Implementations of the first example may include one or more of the following features. Processing the digital data to detect a condition of the cellular base station includes determining a measured value of a nonlinear emission power level of the synchronization signal; and comparing the measured value of the nonlinear emission power level with a regulatory threshold value of the nonlinear emission power level to determine the condition of the cellular base station. The method includes based on the measured value, determining a future value of the nonlinear emission power level for a future time to predict potential failure of the cellular base station.

Implementations of the first example may include one or more of the following features. The method includes repeating the tuning and operation of the vapor cell sensor during a plurality of distinct time periods to detect the condition of the cellular base station during each of the distinct time periods. The method includes comparing the detected conditions of the cellular base station over months or years. The method includes tuning the vapor cell sensor to a second carrier frequency of second electromagnetic radiation emitted from a second cellular base station; by operation of the vapor cell sensor tuned to the second carrier frequency, generating a third set of optical signals based on an interaction between the vapor and a second synchronization signal transmitted from the second cellular base station; tuning the vapor cell sensor to a harmonic of the second carrier frequency; by operation of the vapor cell sensor tuned to the harmonic of the second carrier frequency, generating a fourth set of optical signals based on an interaction between the vapor and the second electromagnetic radiation emitted from the second cellular base station; and by operation of the control system, converting the third and fourth sets of optical signals to second digital data; and processing the second digital data to detect a condition of the second cellular base station.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method of performing over-the-air testing of a cellular base station, the method comprising:
    tuning a vapor cell sensor to a carrier frequency of radio frequency (RF) radiation emitted from the cellular base station, the vapor cell sensor comprising a vapor having Rydberg states;
    by operation of the vapor cell sensor tuned to the carrier frequency, generating a first set of optical signals based on an interaction between the vapor and a synchronization signal transmitted from the cellular base station;
    tuning the vapor cell sensor to a harmonic of the carrier frequency;
    by operation of the vapor cell sensor tuned to the harmonic of the carrier frequency, generating a second set of optical signals based on an interaction between the vapor and the RF radiation emitted from the cellular base station; and
    by operation of a control system communicably coupled to the vapor cell sensor:
        converting the first and second sets of optical signals to digital data; and
        processing the digital data to detect a condition of the cellular base station.

2. The method of claim 1, wherein the RF radiation comprises spurious emissions from the cellular base station, and generating the second set of optical signals comprises generating the second set of optical signals based on an interaction between the vapor and the spurious emissions.

3. The method of claim 1, wherein the first and second sets of optical signals are generated during an installation stage of the cellular base station, and detecting the condition of the cellular base station comprises detecting the condition during the installation stage.

4. The method of claim 1, wherein the first and second sets of optical signals are generated during an active operation stage of the cellular base station, and detecting the condition of the cellular base station comprises detecting the condition during the active operation stage.

5. The method of claim 1, wherein the first and second sets of optical signals are generated during a pre-installation stage of the cellular base station, and detecting the condition of the cellular base station comprises detecting the condition during the pre-installation stage.

6. The method of claim 1, comprising:
    operating a user equipment with a receiver at a location of the vapor cell sensor, wherein operating the user equipment causes the cellular base station to direct the synchronization signal toward the vapor cell sensor during the operation of the vapor cell sensor.

7. The method of claim 1, wherein the first and second sets of optical signals are generated while the vapor cell sensor resides at a measurement location, and the method comprises:
    by operation of a location detection system associated with the vapor cell sensor, detecting the measurement location of the vapor cell sensor; and
    by operation of the control system, associating the detected condition of the cellular base station with the measurement location.

8. The method of claim 7, wherein the measurement location is a first measurement location, the condition of the cellular base station is a first condition, and the method comprises:
    moving the vapor cell sensor to a second measurement location;
    by operation of the location detection system, detecting the second measurement location of the vapor cell sensor;
    by operation of the vapor cell sensor at the second measurement location, generating further sets of optical signals based on an interaction between the vapor and the synchronization signal transmitted from the cellular base station; and
    by operation of the control system:
        detecting a second condition of the cellular base station based on the further sets of optical signals; and
        associating the second condition of the cellular base station with the second measurement location.

9. The method of claim 1, wherein the vapor cell sensor comprises a dielectric cell that contains the vapor having Rydberg states, and the first and second sets of optical signals are independent of an orientation of the dielectric cell relative to the cellular base station.

10. The method of claim 1, wherein processing the digital data comprises detecting at least one of:
    out-of-band emissions from the cellular base stations; or
    spurious emissions from the cellular base stations.

11. The method of claim 1, wherein the carrier frequency and the harmonic of the carrier frequency are in a microwave frequency range below 7.125 GHZ.

12. The method of claim 1, wherein the carrier frequency and the harmonic of the carrier frequency are in a millimeter-wave frequency range above 24.25 GHz.

13. The method of claim 1, wherein the vapor cell sensor resides in a Fresnel zone associated with the cellular base station during operation of the vapor cell sensor.

14. The method of claim 1, comprising:
    identifying the synchronization signal by detecting an amplitude or phase change in the first set of optical signals; and
    synchronizing operation of the control system with the synchronization signal.

15. The method of claim 1, wherein processing the digital data comprises:
passing the digital data through one or more matched filters to identify properties of the synchronization signal.

16. The method of claim 15, wherein passing the digital data through one or more matched filters comprises:
constructing the one or more matched filters using frequency-domain signal processing; and
decoding the synchronization signal from the cellular base station using the one or more matched filters.

17. The method of claim 1, wherein processing the digital data comprises:
measuring a single pulse of the synchronization signal.

18. The method of claim 1, wherein processing the digital data comprises:
detecting a set of pulses of the synchronization signal; and
averaging the set of pulses of the synchronization signal.

19. The method of claim 1, wherein processing the digital data comprises:
detecting a phase shift in the synchronization signal.

20. The method of claim 1, wherein processing the digital data comprises:
measuring an amplitude of a single pulse to determine a power level of the synchronization signal.

21. The method of claim 1, comprising:
tuning the vapor cell sensor to a second harmonic of the carrier frequency;
by operation of the vapor cell sensor tuned to the second harmonic of the carrier frequency, generating a third set of optical signals based on the interaction between the vapor and the RF radiation transmitted from the cellular base station;
tuning the vapor cell sensor to a third harmonic of the carrier frequency;
by operation of the vapor cell sensor tuned to the third harmonic of the carrier frequency, generating a fourth set of optical signals based on an interaction between the vapor and the RF radiation transmitted from the cellular base station; and
by operation of the control system:
converting the first, second, third and fourth sets of optical signals to the digital data; and
processing the digital data to detect a condition of the cellular base station.

22. The method of claim 1, wherein processing the digital data to detect a condition of the cellular base station comprises:
determining a measured value of a nonlinear emission power level of the synchronization signal; and
comparing the measured value of the nonlinear emission power level with a regulatory threshold value of the nonlinear emission power level to determine the condition of the cellular base station.

23. The method of claim 22, comprising:
based on the measured value, determining a future value of the nonlinear emission power level for a future time to predict potential failure of the cellular base station.

24. The method of claim 1, comprising repeating the tuning and operation of the vapor cell sensor during a plurality of distinct time periods to detect the condition of the cellular base station during each of the distinct time periods.

25. The method of claim 24, comprising comparing the detected conditions of the cellular base station over months or years.

26. The method of claim 1, comprising:
tuning the vapor cell sensor to a second carrier frequency of second RF radiation emitted from a second cellular base station;
by operation of the vapor cell sensor tuned to the second carrier frequency, generating a third set of optical signals based on an interaction between the vapor and a second synchronization signal transmitted from the second cellular base station;
tuning the vapor cell sensor to a harmonic of the second carrier frequency;
by operation of the vapor cell sensor tuned to the harmonic of the second carrier frequency, generating a fourth set of optical signals based on an interaction between the vapor and the second RF radiation emitted from the second cellular base station; and
by operation of the control system:
converting the third and fourth sets of optical signals to second digital data; and
processing the second digital data to detect a condition of the second cellular base station.

* * * * *